United States Patent [19]

Yoo

[11] Patent Number: 5,241,134
[45] Date of Patent: Aug. 31, 1993

[54] TERMINALS OF SURFACE MOUNT COMPONENTS

[76] Inventor: Clarence S. Yoo, 6600 Pharr Mill Rd., Harrisburg, N.C. 28075

[21] Appl. No.: 908,826

[22] Filed: Jul. 1, 1992

Related U.S. Application Data

[63] Continuation of Ser. No. 583,229, Sep. 17, 1990, abandoned.

[51] Int. Cl.5 .................................................. H01R 4/02
[52] U.S. Cl. ..................................... 174/94 R; 29/843; 29/854; 29/860; 174/259; 174/260; 228/180.21; 439/884; 361/772; 361/773
[58] Field of Search ................... 174/94 R, 259, 260, 174/261; 361/405, 408, 404; 29/843, 854, 860; 439/884, 885, 886; 228/180.2

[56] References Cited

U.S. PATENT DOCUMENTS

| | | | |
|---|---|---|---|
| 4,064,356 | 12/1977 | Marler, Jr. et al. | 174/94 R X |
| 4,396,140 | 8/1983 | Jaffe et al. | 228/123 |
| 4,607,782 | 8/1986 | Mims | 228/180.2 |
| 4,657,172 | 4/1987 | Lee | 228/180.2 |
| 4,722,470 | 2/1988 | Johary | 228/180.2 |
| 4,777,564 | 10/1988 | Derfiny | 361/405 |
| 4,818,823 | 4/1989 | Bradley | 361/405 X |
| 4,907,991 | 3/1990 | Kobayashi | 361/405 X |
| 4,949,223 | 8/1990 | Achiwa | 361/405 X |
| 4,959,590 | 9/1990 | Hatada et al. | 228/180.2 X |
| 4,991,666 | 2/1991 | Septfons et al. | 174/261 |
| 5,012,388 | 4/1991 | Kabeshita et al. | 361/405 X |

OTHER PUBLICATIONS

Ad, Circuits Manufacturing, Feb., 1990 for NAS Electronics (copy enclosed).

*Primary Examiner*—Morris H. Nimmo

[57] ABSTRACT

The prior art terminal for making a solder bond between a lead and a bond site is modified so as to enhance the reliability of the solder bond. In one embodiment, this modification entails solder relief terminals: solder relief holes through the terminal, notches, grooves or ridges on the surface of the terminal, or bending of the terminal. In a second embodiment, this modification entails predeposit of a predetermined and controlled amount of solid solder and flux on the terminal.

1 Claim, 10 Drawing Sheets

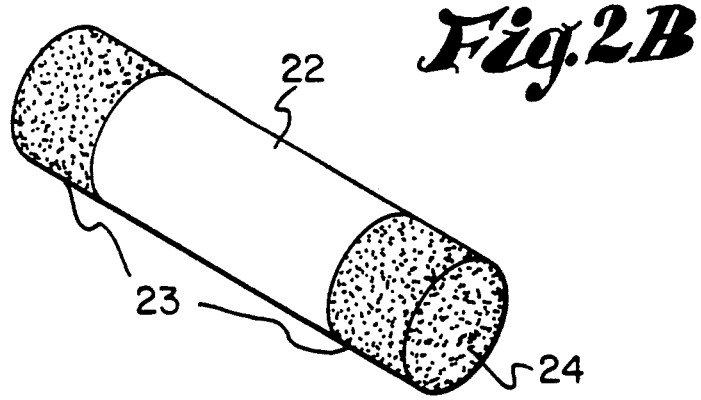
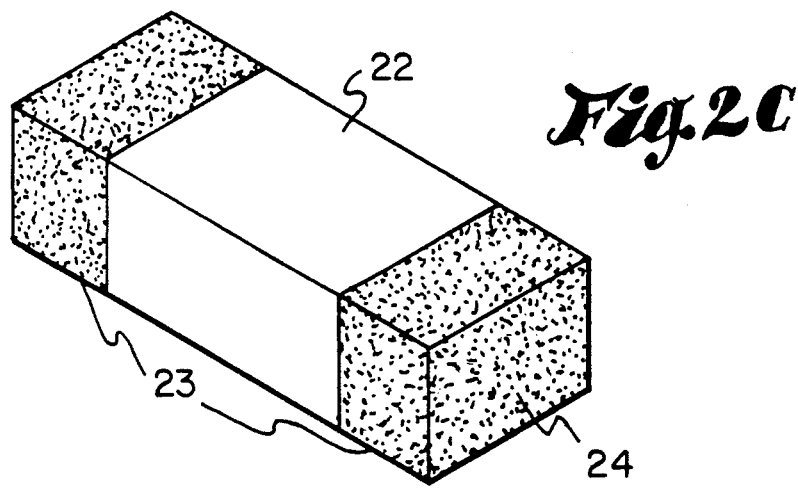
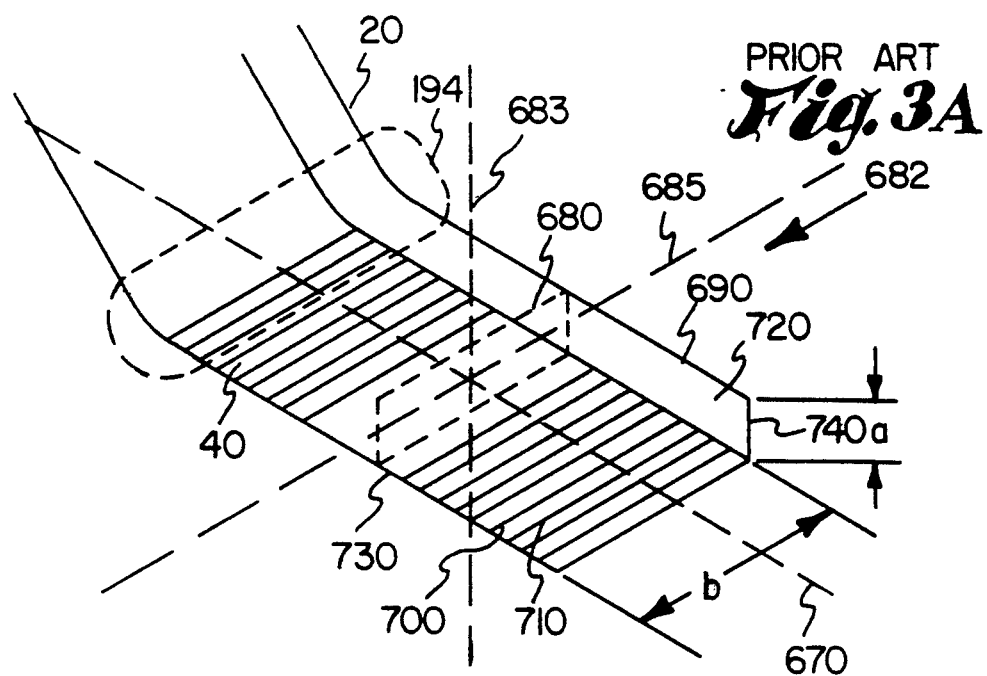

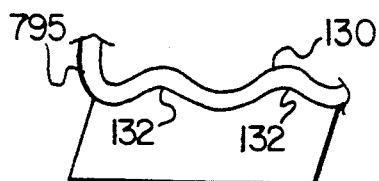
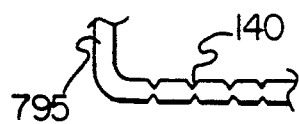
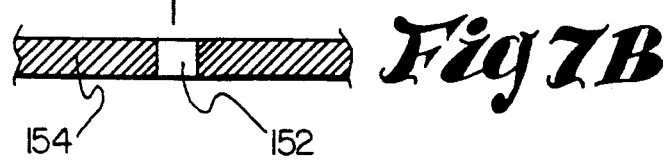
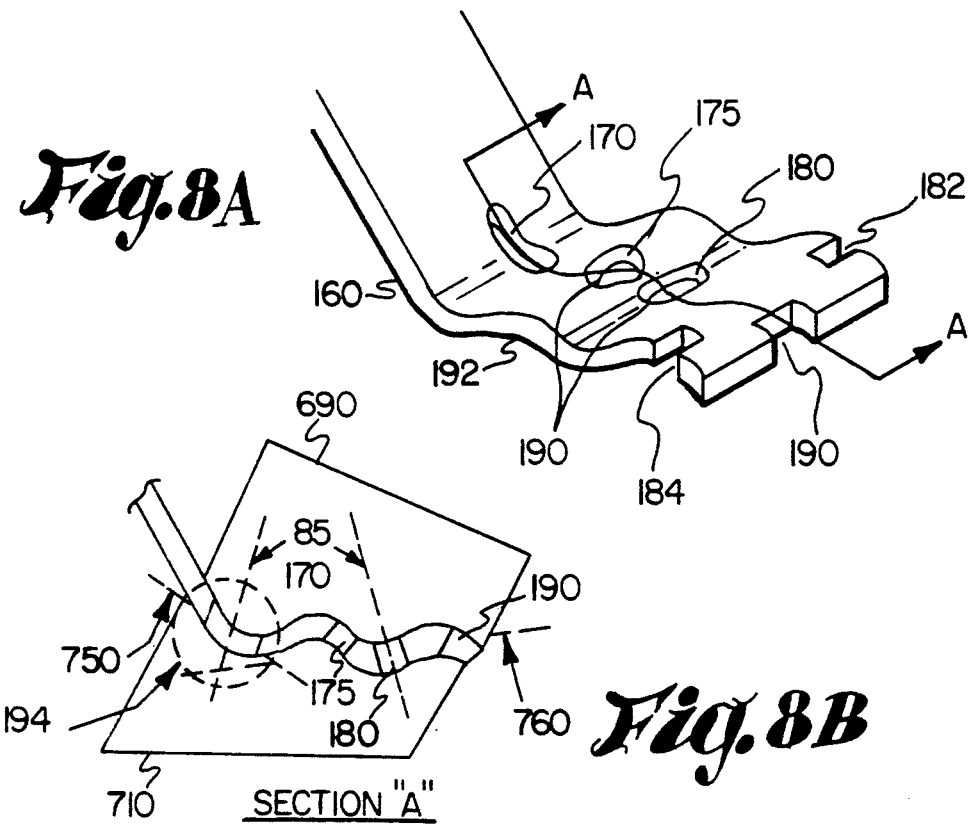

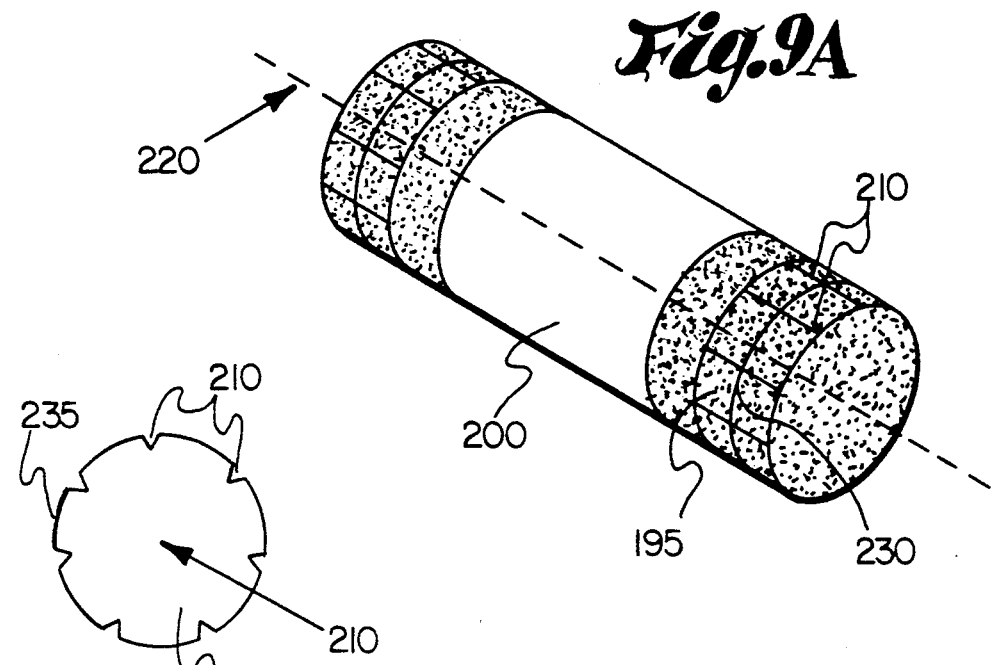
Fig.9A
Fig.9B
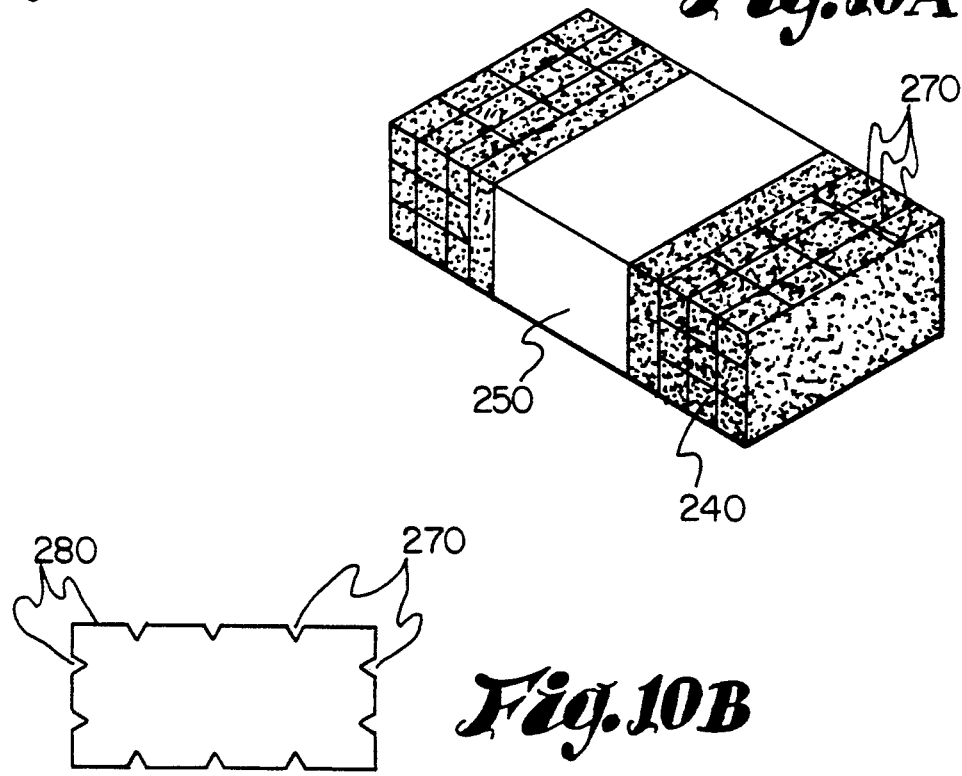
Fig.10A
Fig.10B

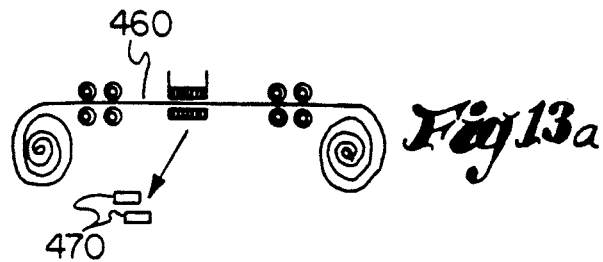
SOLDER PIECES PUNCHED OUT
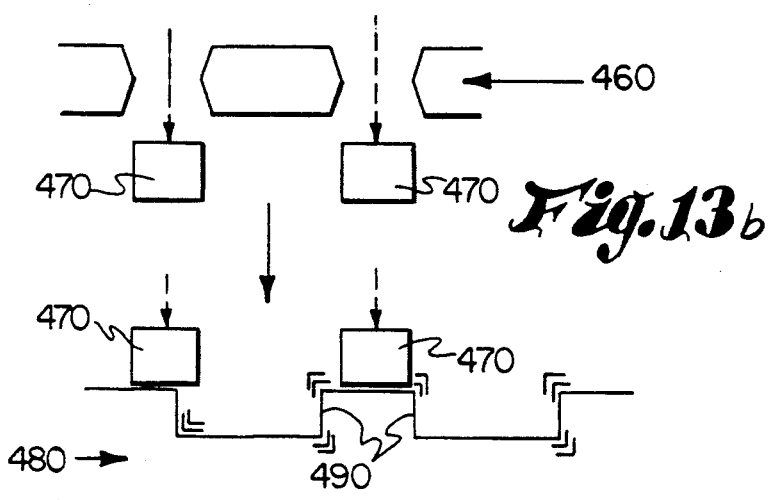
SOLDER PIECES DROPPED
SOLDER PIECES DROPPED ONTO MOLD HOLDER
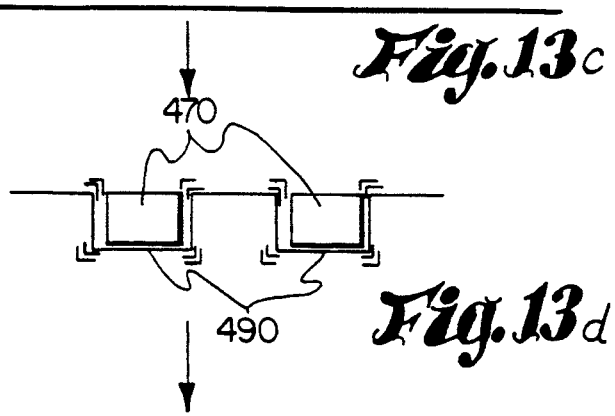
SOLDER PIECES FALL INTO VIBRATION MOLDS
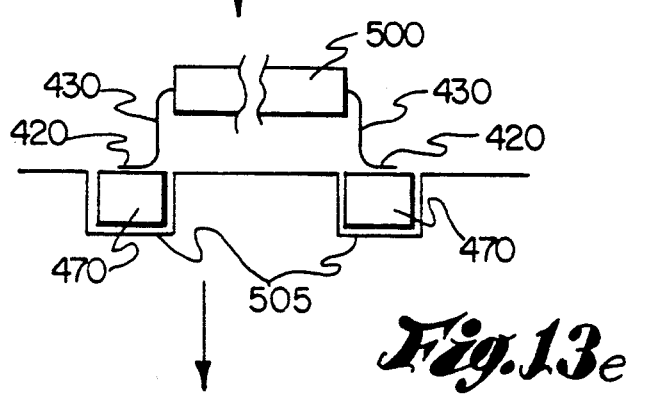
TERMINALS PLACED IN CONTACT WITH SOLDER PIECES

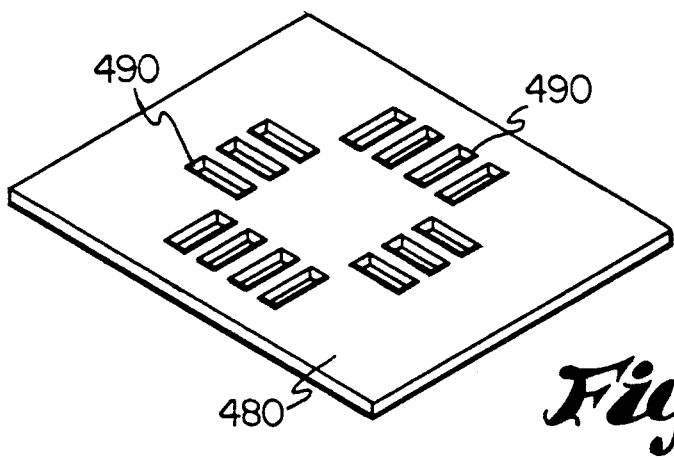
Fig. 13c'
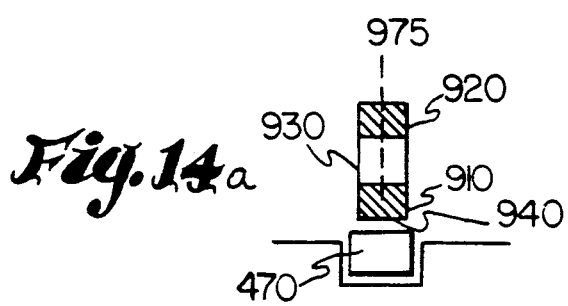
Fig. 14a  FIRST TERMINAL PLACED IN CONTACT WITH FIRST SOLDER PIECE
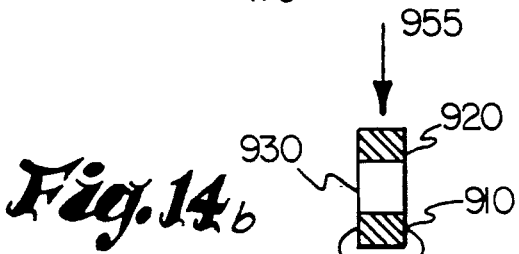
Fig. 14b  REFLOWED
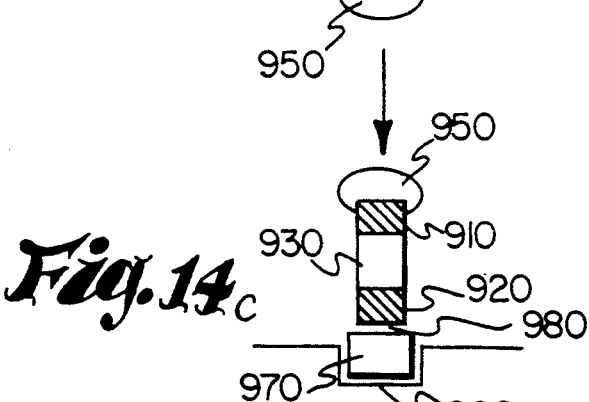
Fig. 14c  INVERTED SECOND TERMINAL PLACED IN CONTACT WITH SECOND SOLDER PIECE
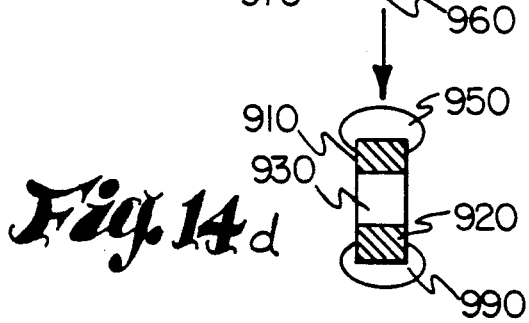
Fig. 14d  REFLOWED, LIFTED AND REMOVED

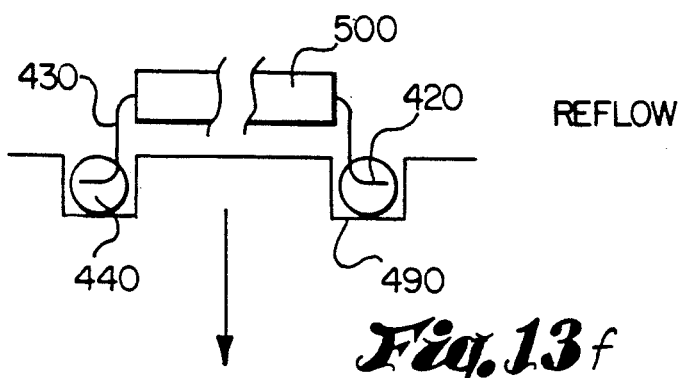
Fig. 13f REFLOW
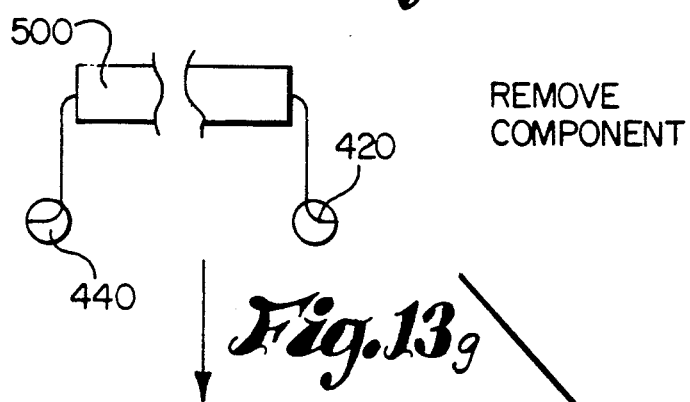
Fig. 13g REMOVE COMPONENT
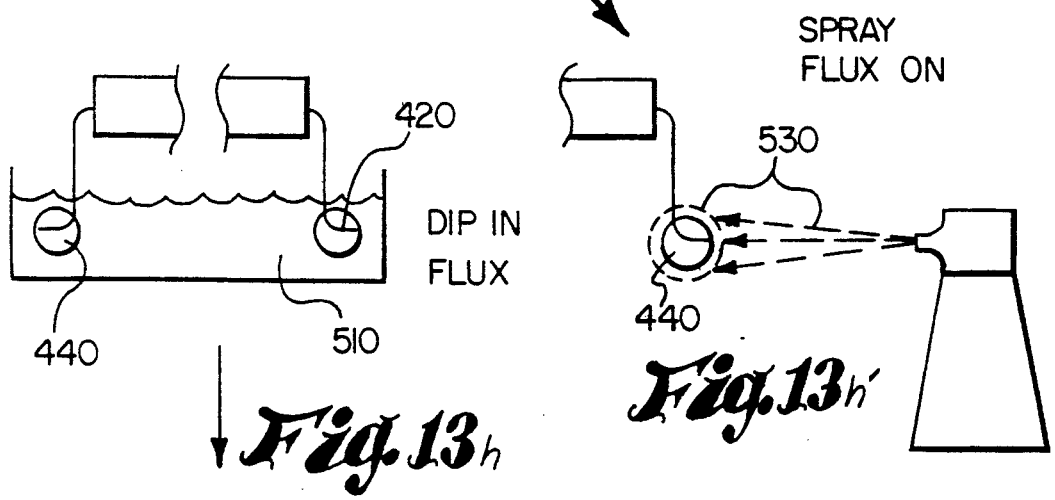
Fig. 13h DIP IN FLUX
Fig. 13h' SPRAY FLUX ON
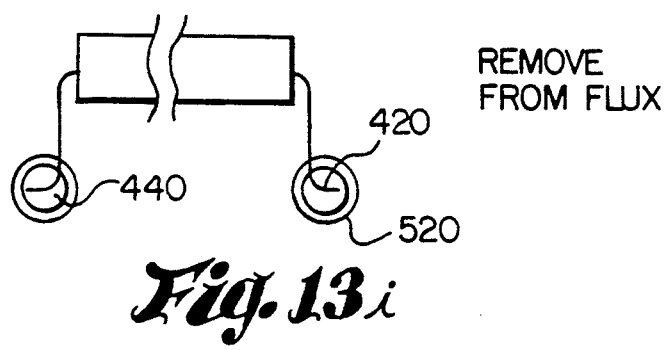
Fig. 13i REMOVE FROM FLUX

TERMINALS OF SURFACE MOUNT COMPONENTS

This application is a continuation of Ser. No. 07/583,229 filed Aug. 17, 1990, now abandoned.

BACKGROUND OF THE INVENTION

1. Field of the Invention

The present invention relates to leads on surface mount components and more particularly to improvements in the configuration and structure of the terminal part of leads on components designed for solder attachment to a substrate.

2. Description of the Prior Art

Assembly of electrical circuits often involves the mounting of components on carriers or cards by attachment of the terminal part of leads to form assembled printed wiring boards. As used herein, the term "lead" means a device on the component which is designed to provide a connection between the component and a bond site. The "terminal" is that part of the lead designed for direct solder connection to the bond site. For example, L-gullwings, J-type lead terminals, Butt-lead type lead terminals, and terminals on 2-terminal components are all examples of leads, as are the contact pads or terminals on so-called "leadless surface mount components." A multi-lead component, such as a quad, may have hundreds of leads whereas a 2-terminal component would have 2.

Surface Mount Technology involves bonding leads of the component on one surface of a printed circuit board on the card, which printed circuit board is patterned to provide the desired electrical connections between different components and sections thereof. Typically, the terminal of each lead is soldered onto a metallic contact pad, land or footprint on the carrier thereby forming a solder joint. Some contact pads are designed so the lead and terminal provide electrical connection between the electrical component and the printed circuit board. Some contact pads might not be designed to provide such an electrical connection. Regardless, the lead and solder joint usually provide mechanical support.

It is general practice for the terminal to have a flat bonding surface (gullwing) or to be J-shaped, and for the corresponding contact pad to be flat. It is well known in the art that a solder joint formed between such a terminal and the contact pad can be weak because of volatiles and bubbles trapped in the solder. Additionally, due to the shape of the solder joint, it may have low resistance to mechanical and thermal shear and stress. One factor contributing to these characteristics is that the terminal has a limited area for adhesion. Furthermore, the solder might migrate or flow to adjacent solder joints during reflow, thereby causing a short-circuit.

The above described characteristics of prior art apparatus and technique may result in a defective board. It is often difficult, costly and time consuming to rework, that is isolate, and remove and replace or correct the defective connection.

U.S. Pat. No. 4,777,564 to Denis J. Derfiny discloses a leadform which provides a more compliant and adhesive solder connection by virtue of an "elf toe" on the terminal. In other words, the terminal presents a convex surface for soldering to the contact pad. The solder can thus adhere to the larger surface area. EP No. 0265631 to IBM discloses a tapered or beveled head on the lead designed to discourage redistribution and migration of the bonding material.

The conventional reflow method for connecting the lead to the contact pad starts with depositing solder paste or cream containing flux and additives on the contact pad, usually by screen or stencil printing. The terminal is then placed on the contact pad. Reflow will heat the solder, the terminal and the contact pad until the solder melts and then forms the bond as it cools.

These known methods are subject to various difficulties. Some difficulties arise from lack of control over the amount of solder at each connection. Insufficient solder would result in open circuits and voids. Excessive solder would cause a physically weak connection. Regardless, there might be bridging and consequential short circuiting between adjacent solder joints. Reflowing is a bulky and expensive technique. Solder paste has a limited shelf life. Furthermore, reworking, that is, removing and replacing a costly component or solder joint, is extremely difficult.

Prior art efforts to solve these problems include predepositing solder on the terminal before bonding the terminal to the contact pad. The following patents are hereby referenced as being typical of known prior art insofar as they disclose predepositing of solder on the terminals before attachment to the carrier:

| Patent No. | Inventor |
|---|---|
| 4,722,470 | Ajay Johary |
| 4,657,172 | Jong S. Lee |
| 4,607,782 | Bruce L. Mims |
| 4,396,140 | Donald Jaffe et al. |

The inventions of Johary and Jaffe have the disadvantages of requiring manual operation and are not suitable for mass production. Furthermore, they involve solder paste. In Lee, solder is applied to inverted J-leads by wave soldering. This invention is limited to J-leads and it has the disadvantages inherent in wave soldering. In Mims, solder adheres to the terminal after the terminal is dipped in a smear of solder paste on a plate. Because there is no specific pad or cavity for each lead, this invention does not adequately control the amount of solder at each connection.

Accordingly, it is a general object of this invention to provide improved Surface Mount component leads so as to improve the reliability in solder connection between the lead and the mounting substrate which overcomes the aforementioned difficulties.

It is a further object of this invention to provide for an improved lead which includes a terminal portion which results in enhanced reliability and fewer defects in solder connections.

It is a further object of this invention to provide an economical method to predeposit solder on the terminal part of the lead in precisely regulated amounts, which method is well suited for automation.

It is a further object of this invention to provide improved Surface Mount component terminals which facilitate rework operations.

SUMMARY OF THE INVENTION

The prior art terminal for making a solder bond between a lead and a bond site is modified so as to enhance the reliability of the solder bond. In one embodiment, this modification entails solder relief terminals: solder relief holes through the terminal, notches, grooves or ridges on the surface of the terminal, or bending of the terminal. In a second embodiment, this modification entails predeposit of a predetermined and controlled amount of solid solder and flux on the terminal.

BRIEF DESCRIPTION OF THE DRAWINGS

FIGS. 2A, 2B and 2C show different views of two different typical 2-terminal surface mount components showing their positioning over contact pads on a carrier.

FIGS. 3A, 3B, 3C, 3D, 3E and 3F show various terminals according to prior art.

FIGS. 6A and 6B is a side view of deformations.

FIGS. 7A and 7B show a solder relief terminal as a modification of a J-shaped lead terminal or a "leadless" terminal.

FIG. 8A is an isometric view of a solder relief terminal as a modification of a gullwing terminal according to the present invention.

FIG. 8B is a cross-section view through A—A of the solder relief terminal shown in FIG. 8A.

FIGS. 9A and 9B show a solder relief terminal as a modification of a terminal of a 2-terminal component with circular cross-section, the modification comprising surface deformation.

FIGS. 10A and 10B show a solder relief terminal as a modification of a terminal of a 2-terminal component with rectangular cross-section, the modification comprising surface deformation.

FIGS. 13A, 13B, 13C, 13C', 13D, 13E, 13F, 13G, 13H, 13H' and 13I show a method of predepositing a solder body on a terminal.

FIGS. 14A, 14B, 14C, 14D show a method of predepositing a solder body on both terminals of a 2-terminal component.

DETAILED DESCRIPTION OF THE INVENTION

Figure 1A:
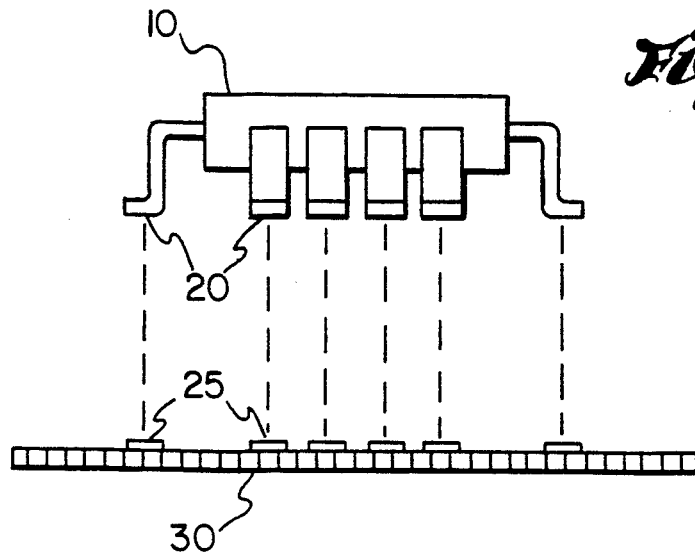
FIGS. 1A and 1B show different views of a typical multi-lead surface mount component with L-gullwing leads and terminals showing its positioning over contact pads on a carrier.
Figure 1B:
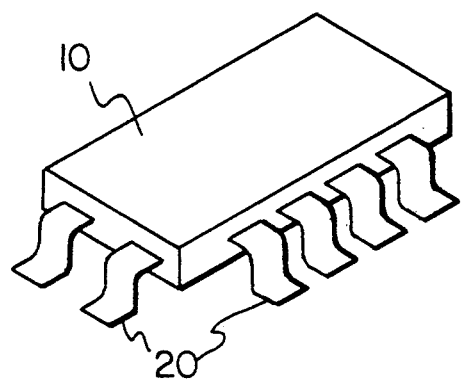
Figure 2A:
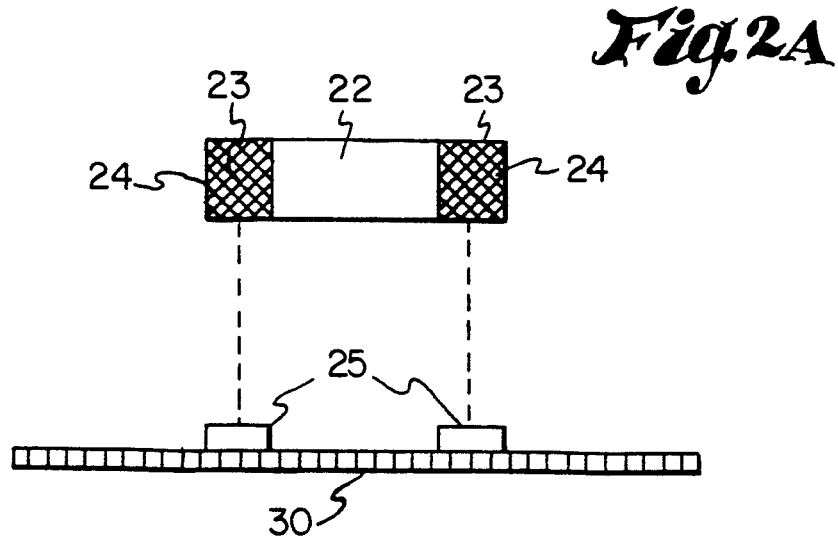

Referring now to the drawings, FIGS. 1A and 1B depict a multi-lead component 10 with L-gullwing leads 20 according to prior art and FIGS. 2A, 2B and 2C depict a 2-terminal component 22 with leads 23 having ends 24 according to prior art. The components are designed for Surface Mount connection to contact pads 25 on a carrier 30 by soldering. These particular components are used by way of example. The principles of the present invention are applicable to all lead configurations, such as J-shaped leads, to all components designed for solder connection to a substrate by through-hole (pin and hole) mounting or any other method, and in fact, to all solder connection of an electrical lead to another conductor and to all solder connections designed for mechanical support.

Figure 3B:
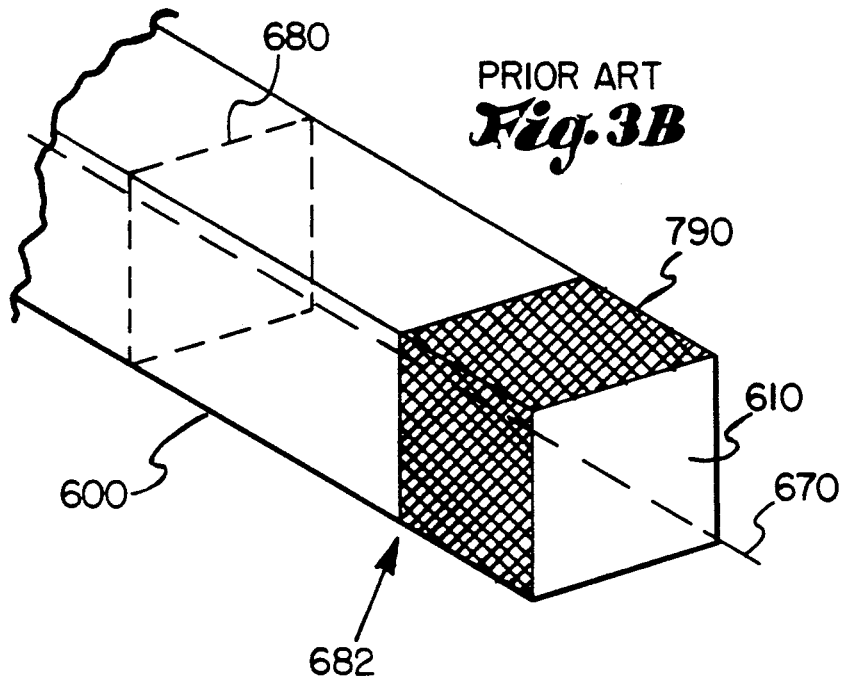
Figure 3C:
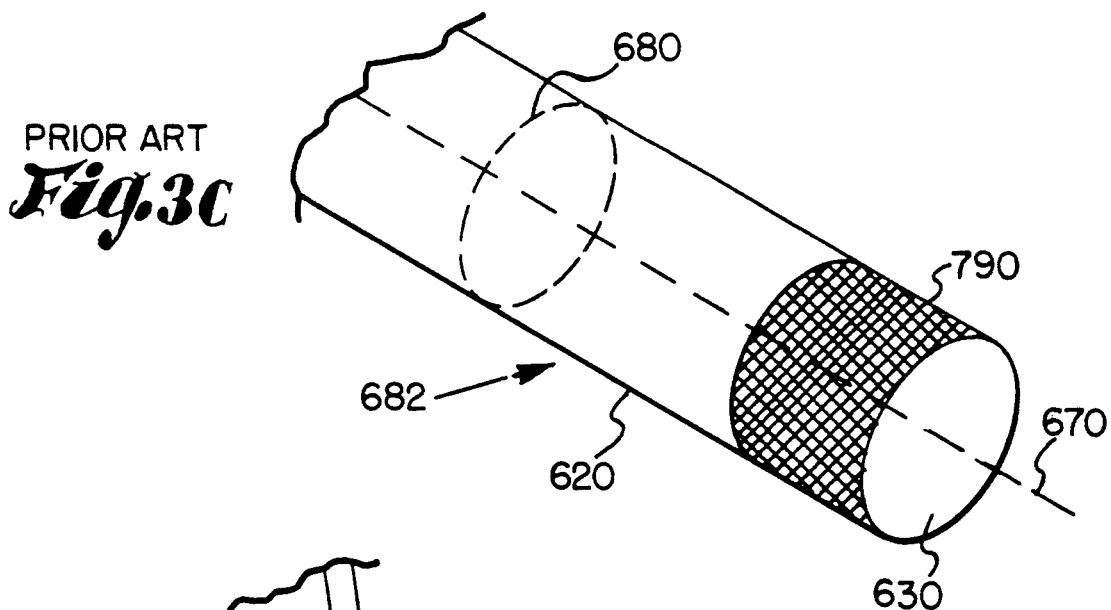
Figure 3D:
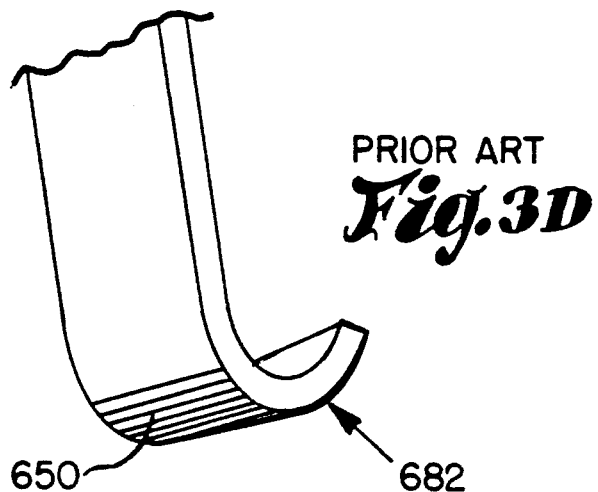
Figure 3E:
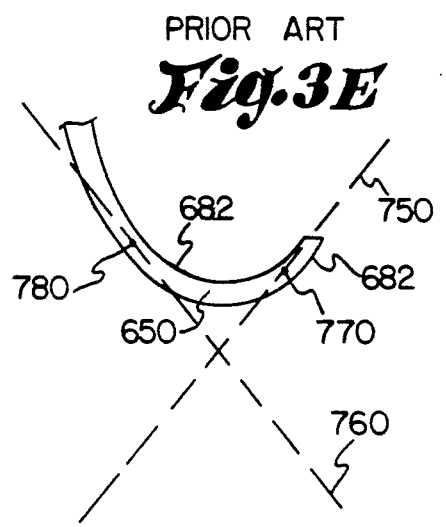
Figure 3F:

Before describing the present invention any further, examples of terminals according to prior art will first be described and shown in more detail in FIGS. 3A through 3F. FIG. 3A shows an underside view of the terminal 40 of a gullwing lead 20, which terminal 40 is that part of the lead 20 designed for direct solder connection to the contact pad 25. FIG. 3B shows a lead terminal 600 with rectangular cross-section 680 and end 610. FIG. 3C shows a cylindrical lead terminal 620 with end 630. FIG. 3D and 3E show a J-shaped lead terminal 650. FIG. 3F shows a typical "leadless" terminal 660 on a so-called "leadless" surface mount component (not shown).

The gullwing lead terminal 20, cylindrical lead terminal 620, and rectangular lead terminal 600 are representative of a "straight" terminal according to prior art. Such a straight terminal will have a straight length axis 670. The cross-section 680 does not vary along the length axis 670. These terminals all have an outer surface 682 and a bonding surface 710, 790 suitable for making a solder bond between the lead and the bond site 25.

In one embodiment, a gullwing flat terminal 40 according to prior art will have a length axis 670, height axis 683 and width axis 685 which are generally mutually orthogonal, that is, mutually perpendicular. It will have a height a and a width b where a is less than b. It has a top surface 690 and a bottom surface 700 generally perpendicular to the height axis 683. The bonding surface 710 is generally on the bottom surface 700. The gullwing flat terminal 40 has edges 720, 730 and 740 all generally parallel to the height axis and on the outside surface 682. The cross-section 680 is generally rectangular, but it need not be so.

It can be seen that a J-shaped lead terminal 650 and a leadless terminal 660 are each modifications of the gullwing flat terminal 40 by bending it so it is n longer straight. Furthermore, there might be different local length axes 750 and 760 which might have different directions at different positions 770 and 780 on the J-shaped lead terminal 650 and the leadless terminal 660. Regardless, the local length axis 750, 760 remains perpendicular to the width axis 685.

Rectangular lead terminals 600 and cylindrical lead terminals 620 are typically used on 2-terminal lead components 22. Because these straight terminals can freely rotate about their length axes 670, it cannot be known in advance which part of the outer surface 682 will be bonded to the bond site 25. Therefore, the bonding surface 790 must be considered to extend around the outer surface 682.

The above described terminals 40, 600, 620, 650 and 660 are intended to be merely representative of the prior art and are not to be taken as depicting all known aspects of prior art.

Solder relief terminals are one embodiment of the present invention. A solder relief terminal 795 includes features which provide the following modifications over a straight terminal 40, 600, 620 according to prior art:

a) means for escape of volatiles and bubbles during the process of soldering using solder paste;

b) means for molten solder to rise during the soldering process thereby forming a "3-dimensional" solder joint; and c) increased bonding surface area on the perimeter, edges or sides of the terminal.

As discussed further below, these features in the preferred embodiments of the solder relief terminals include solder relief holes 800, notches, grooves or other similar structural modifications 100 and 140 of the outer surface 682 of the terminal, or selective bending 130 of the terminal.

Figure 4A:
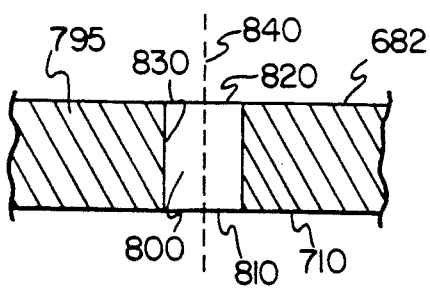
FIGS. 4A and 4B show a side view of solder relief holes.
Figure 4B:
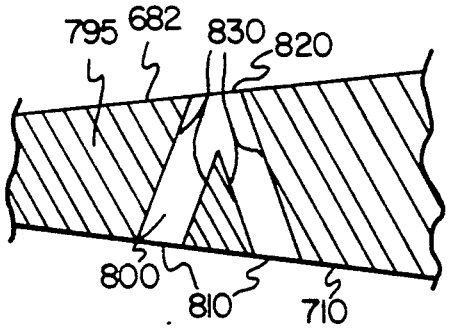
Figure 5A:
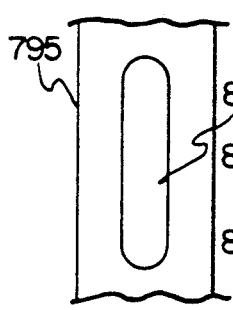
FIGS. 5A, 5B, 5C, 5D and 5E is a top view of solder relief holes on a gullwing flat terminal.
Figure 5B:
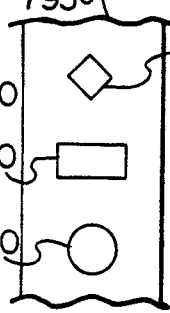
Figure 5C:
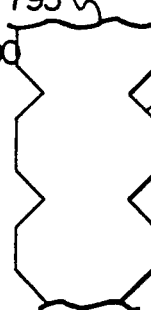
Figure 5D:
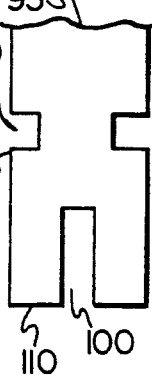
Figure 5E:
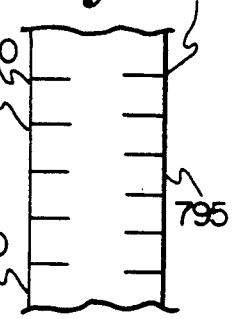

As shown in FIGS. 4 and 5, a solder relief hole 800 has a bonding opening 810 on the bonding surface 710 and an escape opening 820 on the outer surface 682 spaced apart from the bonding opening 810. The solder relief hole 800 also has hole sides 830 that extend between the bonding opening 810 and the escape opening 820. In one embodiment shown in FIG. 4A, the hole sides are parallel to a straight hole axis 840, but they need not be, as shown in FIG. 4B.

In one embodiment, at least part of the hole sides 830 of the solder relief hole 100 opens onto an edge 110 on the outside surface 682 of the solder relief terminal 795. Such a solder relief hole 100 might be a notch, groove, ridge or slit. These solder relief holes 100 are examples of an embodiment of the present invention called a surface deformation. In such an embodiment, the mounting surface 710, 790 is deformed in such a way that the solder relief terminal 795 remains straight. A further example of a surface deformation is shown at 140 in FIG. 6B.

Another embodiment of a solder relief terminal 795 has a length deformation 130 shown in FIG. 6A. In such an embodiment, the solder relief terminal 795 is bent so that it is no longer straight. A length deformation embodiment of a solder relief terminal might have one or more different local length axes 750, 760 which might be different than the length axis 670. Furthermore, the length deformation 130 may have a concave portion 132 on the bonding surface 134.

The above features may appear in combination on a single solder relief terminal. When the surface deformation embodiment is combined with other features, the terms "local length axis" 750, 760 and "length axis" 670 will be used interchangeably and the height axis will be considered to be perpendicular to it. For all practical purposes, if these features are combined, solder relief holes 800 and surface deformations 100 usually appear on a straight terminal which is then bent according to a length deformation embodiment.

FIG. 7A shows an example of a solder relief terminal 150 comprising a solder relief hole 152 in a J-shaped lead terminal 650 or a leadless terminal 660. The solder relief terminal 150 would be formed by applying a solder relief hole 152 embodiment to a straight gullwing flat terminal 154 as shown in FIG. 7B and then applying a length deformation embodiment, that is, bending it.

FIG. 8 shows an example of a solder relief terminal as a modification of a gullwing terminal 160. This embodiment is a combination of solder relief holes 170, 175, 180, 182, 184 and 190, and length deformations 192. In this example, the solder relief holes 170, 175, 180, 182, 184 and 190 open onto the bonding surface 710 and the top surface 690 and the hole sides are parallel to a straight hole axis 85. Solder relief hole 170, by way of example, is on the terminal knee 194. Solder at this location has a high incidence of cracking, and a solder relief hole 170 here reduces the cracking.

It is found that in all practicality, a solder relief hole 175 with circular cross-section should have a minimum diameter at least a/4 and a maximum diameter no greater than b/2. It is also found that in all practicality, a solder relief hole 170, 180 with elongated cross-section should have a width at least a/4 and no greater than b/2, and a length no more than c/2 where c is the length. The total area of the opening of all solder relief holes should be no greater than ⅓ *(b*c).

FIG. 9 shows an example of a solder relief terminal 195 based on a cylindrical terminal of a 2-terminal component 200. This embodiment involves grooves 210 parallel to the axis 220, and notches 230 around the perimeter 235. FIG. 10 shows an example of a solder relief terminal 240 based on a terminal of a 2-terminal component 250 with rectangular cross-section. This embodiment involves grooves 270 on the outside surfaces 280. In general, the surface deformation embodiment for a solder relief terminal on a 2-terminal component may appear anywhere and in any direction on the outside surface.

Figure 11A:
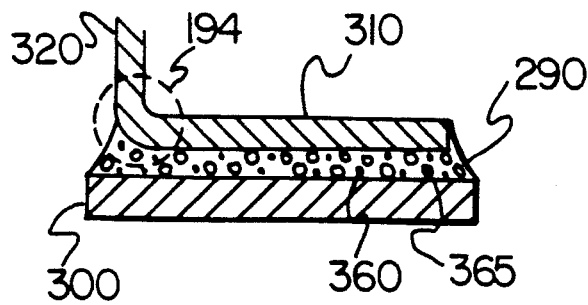
FIGS. 11A, 11B and 11C show a solder joint between a contact pad and gullwing terminals according to prior art and according to the present invention.
Figure 11B:
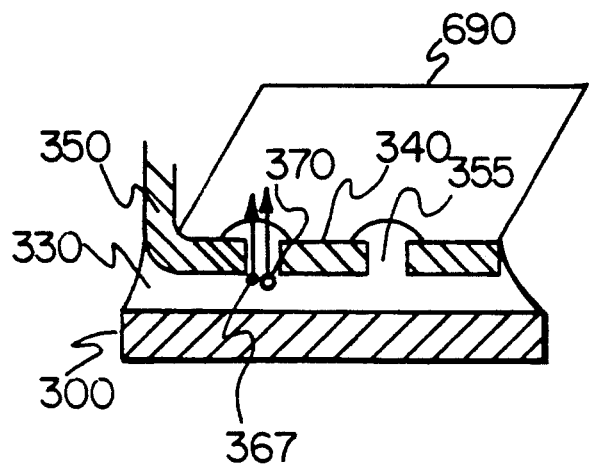
Figure 11C:
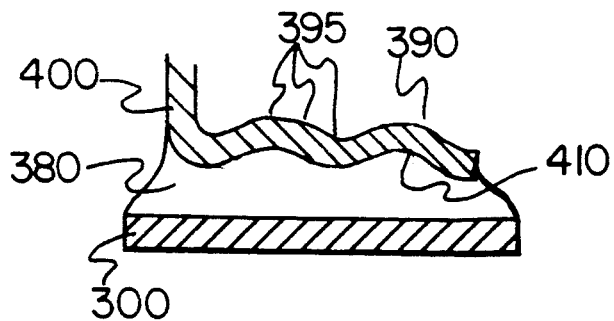

The method of utilizing the solder relief terminals in the process of soldering using solder paste is illustrated in the drawings in FIGS. 11B and 11C. FIG. 11A shows a solder joint 290 between a contact pad 300 and a terminal 310 of a gullwing lead 320 according to prior art. FIG. 11B shows a corresponding solder joint 330 between a contact pad 300 and a solder relief terminal 340 of a gullwing lead 350. According to the present invention, this solder relief terminal 340 has solder relief holes 355.

It is noted that in the prior art terminal 310, volatiles 360 forming bubbles 365 in the molten solder would each be trapped as the solder cools and forms the solder joint 290. These bubbles 360 would weaken the strength of the bond. Furthermore, the solder 290 might push the terminal 310 causing it to float or shift or causing the solder 290 itself to migrate, perhaps to adjacent solder joints (not shown), causing a short-circuit. In contrast, in the solder relief terminal 340 according to the present invention, many volatiles 367 and bubbles 370 in the molten solder would escape through the solder relief hole 355 and would not be present as the solder cools and forms the solder joint 330. Hole sides and surface deformations would increase the surface area available for solder adherence, as compared to prior art terminals. This increase would provide an opportunity for the solder to adhere on the sides and to rise by capillary action. These effects, increased available surface area for solder adhesion and capillary action, would reduce the amount of solder available for migration during reflow and would reduce the force pushing the terminal. Furthermore, for the same reasons, the solder joint 330 would be 3-dimensional. In other words, the solder joint 330 would have a greater height and would not merely involve adhesion on 2 parallel plane surfaces. All of the above factors would increase the adhesion, strength and reliability of the solder joint. In addition, because solder would rise to the top surface 690, it would be easy to detect from above whether or not a solder joint 330 had formed.

FIG. 11C shows a corresponding solder joint 380 between a contact pad 300 and a terminal 390 with a length deformation 395 according to the present invention. It is believed that this terminal 390 provides greater adhesion than the prior art terminal 310 because of increased bonding surface area 410 for the solder joint 380 and because the bonding surface 410 presents diverse angles.

The gullwing terminals 340 and 390 are shown by way of example. The benefits described will also apply to all solder relief terminals according to the present invention.

Figure 12:
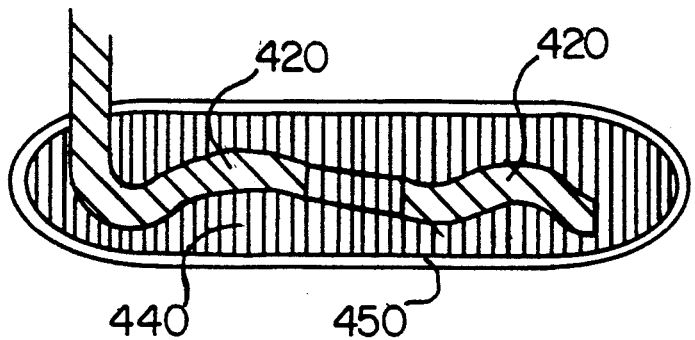
FIG. 12 shows a solder body predeposited on a terminal.

In practicing the disclosed invention, a predetermined amount of solidified solder 440 may by affixed to the terminal 420 as shown in FIG. 12 before positioning the terminal 420 for the soldering process. In one embodiment, the body of solder 440 has flux 450 on it. This body of solder is obtained from a sheet of solder foil 460 of generally uniform thickness. Sheets of solder foil 460 are available in select thicknesses, such as 0.005" and 0.010", with variances according to specification.

In one embodiment, solder pieces 470 are punched and removed from the solder sheet 460 as shown in FIGS. 13A, and 13B. As shown in FIG. 13C, the solder pieces 470 are then dropped onto a mold holder 480. The mold holder 480 has vibrating molds 490 lined with material to which liquid solder does not adhere and bond. In other words, the molds are not wettable. After the solder pieces 470 are dropped onto the mold holder 480, they fall into the molds 490 as shown in FIG. 13D. As shown in FIG. 13E, the component 500 is then placed over the mold holder 480 and positioned so the terminals 510 make contact with the solder pieces 470 and the no longer vibrating molds 505. As shown in FIG. 13 the solder is then reflowed and cooled to form a solder body 440 on the terminal 420. As shown in FIG. 13G, the component 500 is then lifted, removing the terminals 420 from the molds 505 with bodies of hardened solder 440 on them.

In one embodiment shown in FIG. 13C', the component 500 is a multi-lead component. The molds 490 in the mold holder 480 are in the pattern of the footprints of the terminals of the component 500. A plurality of solder pieces 470 are transferred to a plurality of molds 490. A plurality of the terminals 420 simultaneously make contact with a plurality of solder pieces 470 in the molds 490, and a plurality of terminals 420 and solder pieces 470 are reflowed forming a plurality of solder bodies 440 on the terminals 420.

In another embodiment of the present invention, shown in FIG. 14, a first and a second solder body 950 and 990 are predeposited on a first and a second end 975 and 980 on corresponding first and second terminals of a 2-terminal component 930, as also depicted in FIGS. 2, 9 and 10, by using a first and a second mold 955 and 960.

In one embodiment, the solder bodies 950 and 990 are attached to the ends 975 and 980 sequentially. As shown in FIG. 14A, the component 930 is placed vertically over the mold holder 955 and positioned so the first end 940 makes contact with the first solder piece 470 in the first mold 955. The solder is then reflowed and cooled forming a first solder body 950 on the first end 940 of the first terminal 910 as shown in FIG. 14B. The component 930 is then inverted and positioned over a mold 960 with second solder piece 970 so the second end 980 makes contact with the second solder piece 970 in the second mold 960 as shown in FIG. 14C. The solder is then reflowed and cooled forming a second solder body 990 on the second end 980 of the second terminal 920, as shown in FIG. 14D. All other steps are identical to the steps for predepositing solder bodies on a multi-lead component 500. It is to be noted that the solder bodies 950 and 990 are predeposited on the ends 975 and 980 of the 2-terminal component 930 because the component 930 can freely rotate about its length axis 210 and 670 and it cannot be known in advance which part of the outer surface 682 will be bonded to the bond site 25.

In one embodiment of the method of predepositing solder bodies according to the present invention, the leads are cleaned (not shown) and flux 520 is applied to the solder bodies 440, for example by dipping terminals 420 with bodies of solder 440 in semi-viscous flux 510. As another example, flux 530 is sprayed on the solder bodies 440. flux is necessary for later soldering of the terminal 420 onto the contact pad 300. A pre-fluxed terminal 420 will eliminate the necessity of putting flux 430 on when the terminal 420 is soldered onto the contact pad 300. Semi-viscous flux acts as tacking material to keep the terminal 420 in position over the contact pad 300. Low/mildly active flux can eliminate the need for cleaning assemblies after reflow.

A significant feature of this invention is that the solder bodies are obtained from a sheet of solder foil of known and uniform thickness. This thickness can be specified. The size of the solder pieces and therefore of the solder bodies can also be controlled in the process of removing the solder pieces from the sheet of solder foil. Accordingly, this invention provides for improved control of the amount of solder predeposited on the terminal as compared to prior art.

Control over the amount of solder in a solder body 440 and, therefore, solder joint 290, 330 and 380 would increase the adhesion, strength and reliability of the solder joint by using the right amount of solder. Solder paste would not be used so there would be no trapped volatiles 360 forming bubbles 365. Because the solder body 440 is already bonded to the terminal 420, there would be less floating and shifting upon bonding to the bond site 300. Predeposited solder bodies 440 make reworking boards much easier since the replacing component would already have solder on its terminals.

In one embodiment of the present invention, part of the terminal is electrically conductive so as to provide an electrical connection between the lead and the solder joint.

While the above embodiments have been described in detail, it is apparent that various changes and modifications are possible without departing from the spirit and scope of the present invention which is set forth in the accompanying claims. For example, various other forms of solder relief on a terminal could be used, so long as they provide a means for escape of volatiles and bubbles from molten solder or increase the adhesion of solder to their terminal by providing 3-dimensional solder joints, greater surface area for adhesion or a surface area for adhesions presented in different directions. As a further example, this invention would apply to terminals on leads of other configurations. As a further example, this invention would apply to other forms of solder connection of components to carriers, and other forms of solder connection of electrical leads, for example to wires, and other forms of solder connection designed to provide mechanical support. As to the solder bodies, they can be deposited on the terminals by any one of a number of means according to the present invention so long as they originate on a sheet of solder foil of select or controlled thickness.

What is claimed is:

1. A terminal comprising a modification of a straight terminal, said straight terminal being a member having a length axis, an outside surface and a bonding surface, said outside surface being suitable for making a solder bond between a lead and a bond site, said modification enhancing the adhesion of said solder bond, said modifications also providing a solder relief terminal including a solder relief hole having a bonding opening in said bonding surface, an escape opening in said outside surface spaced apart from said bonding opening, and hole sides extending between said bonding opening and the escape opening.

* * * * *